United States Patent [19]
Rzad et al.

[11] Patent Number: 5,643,637
[45] Date of Patent: Jul. 1, 1997

[54] METHOD OF GRADING THE ELECTRIC FIELD OF AN ELECTRODE

[75] Inventors: Stefan Jacek Rzad, Rexford; Michael Wayne DeVre, Scotia, both of N.Y.

[73] Assignee: General Electric Company, Schenectady, N.Y.

[21] Appl. No.: 406,435

[22] Filed: Mar. 20, 1995

Related U.S. Application Data

[62] Division of Ser. No. 215,955, Mar. 18, 1994, Pat. No. 5,431,963.

[51] Int. Cl.$^6$ .................................................. C23C 14/02
[52] U.S. Cl. ..................... 427/534; 427/79; 427/122; 427/170; 427/228; 427/238; 427/249; 427/255.2; 427/255.3; 427/255.7; 427/309; 427/402; 427/535; 427/539; 427/540; 427/573; 427/574; 427/578; 427/579; 427/580
[58] Field of Search ............................... 427/534, 535, 427/539, 579, 79, 122, 309, 419.3, 419.7, 573, 574, 578, 580, 249, 255.2, 255.3, 255.7, 402, 170, 228, 238

[56] References Cited

U.S. PATENT DOCUMENTS 5,431,963  7/1995  Rzad et al. ..................... 427/249 X

*Primary Examiner*—Bernard Pianalto
*Attorney, Agent, or Firm*—William H. Pittman

[57] ABSTRACT

A method is described for grading the electrical field at the surface of an electrode by depositing a semiconductive coating thereon. An electrode substrate is powered at a preselected temperature and power. A mixture of gases is then passed through an electrical discharge to ionize at least a portion thereof to form the semiconductive coating on the surface of the electrode. Also described is the plasma enhanced chemical vapor deposition of a diamondlike carbon (DLC) film onto a substrate. A substrate is maintained at a preselected DLC forming temperature and is negatively biased at a first preselected voltage. A first gaseous mixture of hydrocarbons and argon is then passed through an electrical discharge to at least partially ionize the hydrocarbons to form DLC film on the substrate. The substrate is then negatively biased at a second preselected voltage lower than the first preselected voltage. A second gaseous mixture of hydrocarbons and argon or hydrogen is then passed through the electrical discharge to at least partially ionize the hydrocarbons to form additional DLC film on the substrate.

9 Claims, No Drawings

METHOD OF GRADING THE ELECTRIC FIELD OF AN ELECTRODE

This application is a division of application Ser. No. 08/215,955, filed Mar. 18, 1994, now U.S. Pat. No. 5,431,963.

BACKGROUND OF THE INVENTION

The present invention relates to electrodes for capacitors and other electrical applications and specifically to fabricating field-graded electrodes and to methods of adhering "diamondlike carbon" (DLC) films to electrodes and other substrates.

Capacitors are commonly employed as elements in electrical circuits to reduce voltage fluctuations in electronic power supplies, to transmit pulsed signals, to generate or detect electromagnetic oscillations at radio frequencies, and to provide electronic time delays. The simplest capacitor consists of two plane, parallel plates of an area, A, separated by a distance, d. If a voltage, V, is applied to the plates, a +q charge will develop on one plate and a corresponding −q charge will develop on the other plate. The charge q developed is related to the applied voltage V by a proportionality constant, C, called the capacitance of the capacitor. The effect of filling the space between the electrodes with a dielectric is to increase the capacitance by a factor, $\kappa$, called the dielectric constant. Filling the space between the electrodes with a dielectric also increases the charge density, on each plate in proportion to the dielectric constant $\kappa$.

DLC films are characterized by an amorphous, polymer-like hydrogen and carbon structure but exhibit physical properties similar to those of single-crystal diamond. Researchers have recognized that the mechanical and electrical insulating properties of DLC films make them, like diamonds, attractive for use in electronic applications.

Thin DLC films suitable for electrical applications have been deposited using a variety of techniques such as plasma enhanced chemical vapor deposition (PECVD). The PECVD technique involves the imposition of a plasma discharge generated by, for example, a capacitively or inductively coupled RF, microwave or DC discharge.

Improvements in and especially closer control of the electrical properties of DLCs would be well received by the electrical industries. Moreover, although conventional DLC films have breakdown voltages exceeding 1 MV/cm, DLC films with improved breakdown strengths also would be well received by the electrical industries. For example, the energy density or storage in a capacitor is directly proportional to the square of its operating stress as determined by the breakdown voltage of its dielectric medium and as given by the equation:

$$\tau = \kappa \epsilon_0 \rho \tag{1}$$

where D is the energy density in the capacitor, $\kappa$ is the dielectric constant of the dielectric medium, $\epsilon_0$ is the permittivity of free space, and E is the applied electric field. That is, energy storage is maximized in capacitors having dielectrics with relatively high breakdown voltages. Exceeding the breakdown voltage of the dielectric, however, results in premature capacitor failure. DLC films having improved breakdown voltages therefore are desirable in the production of capacitors having correspondingly higher energy densities.

To be useful as capacitor dielectrics, DLC films must not only possess relatively high resistivities and energy densities, but must also adhere tenaciously to metal (e.g., aluminum) electrodes without spalling. Aluminum, for example, is the metal of choice for capacitor electrodes because of its inherently low density. For high voltage applications however, the DLC film thicknesses required to support high voltages are characterized by large internal stresses. These internal stresses often cause delaminations in aluminum-DLC-aluminum composite structures. Although pre-cleaning of the substrate surface with an argon plasma etch may improve adherence, Gehan et al., "Influence of DC Bias Voltage on the Refractive Index and Stress of Carbon-Diamond Films Deposited From a $CH_4$/Ar Plasma", *J. Appl. Phys.*, Vol. 70 (10) (Nov. 15, 1991), the disclosure of which is expressly incorporated herein by reference, have reported that pre-cleaning must be carefully performed as it has the potential to cause significant damage to the surface of the substrate. Such surface damage is magnified in capacitor applications inasmuch as any defect on the electrode will result in an electric field enhancement leading to an increased charge injection and a corresponding lowering of the breakdown voltage of the dielectric and the energy storing capacity of the capacitor. Accordingly, methods for depositing DLC films onto, for example, smooth aluminum electrodes and for fabricating field-graded electrodes prior to, for example, the deposition of DLC films thereon would be well received by the electrical industries.

BROAD STATEMENT OF THE INVENTION

The present invention is directed to the fabrication of field-graded electrodes and to the deposition of DLC films onto electrodes and other such substrates. By modifying the conventional PECVD process to include a short but relatively high power deposition step, the adhesion of thick DLC films to, for example, smooth electrode substrates may be improved. Moreover, the substrates themselves may be field-graded with a semiconductive PECVD coating.

Accordingly, the present invention may be seen to advantageously facilitate the production of, for example, capacitors having increased energy storage capabilities. Inasmuch as the energy stored in a capacitor depends on the square of the operating stress of its dielectric, the highest energy storage is attained when the breakdown voltage of the dielectric is maximized. Any defect on the electrode, however, will produce an electric field enhancement which, in turn, will increase charge injection and correspondingly lower the breakdown voltage of the dielectric. Thus, the present invention, in providing for, field-graded electrodes and for the adhesion of relatively thick DLC films thereto, will advantageously facilitate the production of capacitors having increased energy storage capabilities. Such capacitors would be in great demand by the electrical industries for use in, for example, power supplies and load leveling devices.

The present invention provides for PECVD of a DLC film onto a substrate. In one embodiment, a substrate is subjected to the following steps without interruption:

plasma etching (e.g., with an argon plasma in the case of aluminum or a hydrogen plasma in the case of silicon) while maintaining said substrate at a temperature in the range of about 25°–100° C. and negatively biasing it at a first preselected voltage;

passing a first gaseous mixture comprising at least one hydrocarbon, usually methane, and argon through an electrical discharge to at least partially ionize the hydrocarbons to form DLC film on the substrate, while negatively biasing said substrate within a second preselected voltage range with an absolute value lower than that of said first preselected voltage; and passing a second gaseous mixture comprising at least one hydrocarbon and argon through said electrical discharge to at least partially ionize said hydrocarbons to form a second portion of said DLC film on said substrate.

In another embodiment, the substrate is etched with a suitable plasma, maintained at a preselected DLC forming temperature and negatively biased as previously described. Said first gaseous mixture is partially ionized to form DLC film on the substrate. A second gaseous mixture of at least one hydrocarbon and hydrogen is then passed through the electrical discharge to at least partially ionize the hydrocarbons and form additional DLC film on the substrate.

The invention further provides a method for grading the electrical field at the surface of an electrode by depositing a semiconductive coating thereon. An electrode substrate is maintained at a preselected temperature on the grounded electrode of a plasma reactor, and the reactor is powered at a preselected power. A mixture of gases, usually (1) silane and helium or (2) at least one hydrocarbon and argon or hydrogen, is then passed through an electrical discharge to ionize at least a portion thereof to form said semiconductive coating on the surface of the electrode.

DETAILED DESCRIPTION OF THE INVENTION

Conventional processes for the low-pressure, metastable growth of DLC films including plasma enhanced (PECVD) techniques are disclosed in, for example, Angus et al., "Low-Pressure Metastable Growth of Diamond and 'Diamondlike' Phases", *Science*, vol. 241, pages 913–921 (Aug. 19, 1988), incorporated herein by reference. The PECVD process involves inductively or capacitively coupling an electrical discharge generated at radio wave or microwave frequencies to a gaseous mixture of hydrocarbons and hydrogen or argon to ionize the gases into a plasma. Alternatively, a DC plasma may be employed. At pressures of about 0.5 torr, DLC may be deposited from the plasma onto a substrate. A negative voltage typically is applied to the substrate to create an electric field through which the carbon ions may be accelerated.

In traditional PECVD processes, it is known to pre-clean silicon substrates prepatory to the deposition of DLC films thereon. For example, Gehan et al., "Influence of DC Bias Voltage on the Refractive Index and Stress of Carbon-Diamond Films Deposited From a CH$_4$/Ar Plasma", *J. Appl. Phys.*, Vol. 70 (10) (Nov. 15, 1991), describe a PECVD process wherein silicon substrates are pre-cleaned in an argon plasma with a DC self bias of −450 V to support DLC films having thicknesses up to about 400 nm. However, the application of DLC films in capacitor structures, for example, has been limited by the high stresses inherent in relatively thick films. Zelez, "Low Stress Diamondlike Carbon Films", *J. Vac. Sci. Technol.*, vol. A1 (2), pp. 305–307 (April–Junne 1983), incorporated herein by reference, describes a hybrid process involving bias sputtering and plasma decomposition of n-butane reported to result in DLC films of up to about 2–3 μm having relatively low stresses. For dielectric applications at relatively high voltages, e.g., −4000 V, however, DLC film thicknesses as high as 10 μm are required. When such films are deposited on the smooth aluminum preferred for capacitor electrodes, for example, the inherent compressive stresses therein often cause the DLC to delaminate.

The adhesion of DLC deposited by PECVD to, for example, smooth substrates such as aluminum and the like may be improved, however, by modifying the conventional PECVD process to include a short but relatively high power CH$_4$/Ar deposition step. The following comparative example is illustrative of the improvements in DLC adhesion to substrates which can be realized by modifying the conventional PECVD process in accordance with the precepts of the present invention.

EXAMPLE 1

DLC films of up to 10 microns were deposited onto silicon wafers coated with 1000 Å thick aluminum sputtered from a Perkin Elmer 4450 Delta Target Magnetron sputtering system and etched in an argon plasma in a Plasma Therm PK1241 Reactive Ion Etcher (RIE) system operated at an RF frequency of 13.56 MHz. The depositions were conducted using the powered electrode of said RIE system. The substrate was powered at from 60 to 250 watts depending upon the process steps employed, i.e., etching, high power argon deposition, or deposition, causing a varying negative bias voltage therein. A process gas stream consisting of methane and argon or hydrogen was introduced into the chamber of the Plasma Therm at preselected flow rates and a pressure of 0.5 Torr. The process conditions for two inventive deposition processes and each process step thereof are summarized in Tables 1–2.

TABLE 1

Deposition Temperature 100° C.

Step 1: Plasma Etch

| | |
|---|---|
| Flow Rate Ar: | 100 sccm |
| Pressure: | 0.2 Torr |
| Power @ 13.56 MHz: | 250 Watts |
| Bias | −315 Volts |
| Time | 11 min |

After 11 min., the pressure was increased to 0.5 Torr for 1 min. and other process conditions were changed gradually until the conditions of Step 2 were met.

Step 2: CH$_4$/Ar Deposition

| | |
|---|---|
| Flow Rate Ar: | 100 sccm |
| CH$_4$: | 50 sccm |
| Pressure: | 0.5 Torr |
| Power @ 13.56 MHz: | 250 Watts |
| Bias | −240 Volts |
| Time | 5 min |

After 5 min., the flow of H$_2$ was increased and flow of Ar was simultaneously decreased until the conditions of Step 3 were met.

Step 3: CH$_4$/H$_2$ Deposition

| | |
|---|---|
| Flow Rate H$_2$: | 100 sccm |
| CH$_4$: | 50 sccm |
| Pressure: | 0.5 Torr |
| Power @ 13.56 MHz: | 250 Watts |
| Bias | −260 Volts |
| Deposition Rate: | 200 Å/min |

The process was continued until the desired film thickness was obtained; e.g., 50 min. for a 10,000 Å thick film.

TABLE 2

Deposition Temperature 37° C.

Step 1: Plasma Etch

| | |
|---|---|
| Flow Rate Ar: | 100 sccm |
| Pressure: | 0.2 Torr |
| Power @ 13.56 MHz: | 250 Watts |

TABLE 2-continued

Deposition Temperature 37° C.

| | |
|---|---|
| Bias | −315 Volts |
| Time | 11 min |

After 11 min., pressure was increased to 0.5
Torr for 1 min. and other process conditions were changed
gradually until the conditions of Step 2 are met.

Step 2: $CH_4/Ar$ High Power Deposition

| | |
|---|---|
| Flow Rate Ar: | 100 sccm |
| $CH_4$: | 50 sccm |
| Pressure: | 0.5 Torr |
| Power @ 13.56 MHz: | 250 Watts |
| Bias | −240 Volts |
| Time | 5 min |

After 5 min., the power and bias were decreased
until the conditions of Step 3 were met.

Step 3: $CH_4/Ar$ Low Power Deposition

| | |
|---|---|
| Flow Rate Ar: | 100 sccm |
| $CH_4$: | 50 sccm |
| Pressure: | 0.5 Torr |
| Power @ 13.56 MHz: | 60 Watts |
| Bias | −75 Volts |
| Deposition Rate: | 100 Å/min |

The process was continued until the desired film
thickness was obtained; e.g., 100 min. for a 10,000 Å thick
film.

At DLC film thicknesses above about 3000–5000 Å, samples fabricated under conventional process conditions evidenced spontaneous delamination due to the inherent compressive stresses of the deposited films. However, the samples fabricated under the inventive conditions summarized in Tables 1 and 2, which included a short, high-power Ar interfacial deposition step, showed good adhesion, i.e., no spalling, of the DLC film to the aluminum even at thicknesses as high as 10 µm. it is preferred that the process not be interrupted after the substrate has been etched. Depending upon design considerations, the process variables, i.e., gas composition, substrate bias, power, deposition time, etc., may be changed either stepwise or continuously to achieve special effects.

Although an improvement in DLC film adherence resulting from the employment of a relatively high power Ar interfacial step has been illustrated both in connection with $CH_4/Ar$ and $CH_4/H_2$ PECVD, it may be appreciated that the described method may be adapted for different substrates such as silicon and the like by substituting, for example, $H_2$ gas for Ar gas in both the etching and the high power interfacial steps. Moreover, although the improvement in DLC film adherence has been illustrated in connection with relatively thick, e.g., 10 µm, DLC films and relatively smooth aluminum substrates, it may also be appreciated that the described method would also prove equally efficacious in adhering thinner films to substrates, or films in general to substrates having surfaces roughed to improve mechanical adhesion.

The present invention, accordingly, may be seen to advantageously facilitate the deposition of DLC films onto smooth substrates to thereby enable the production of capacitors having increased energy storage capabilities. Inasmuch as the energy stored in a capacitor depends on the square of the operating stress of the dielectric, the highest energy storage is realized when the breakdown voltage of the dielectric is maximized. Accordingly, by practicing the precepts of the present invention to effect the deposition of DLC films onto smooth electrodes, capacitors having increased energy storage capabilities may be realized.

Unfortunately, perfectly smooth electrodes cannot be attained even under the most tightly controlled process conditions because of the presence of surface asperities. Any defect on the electrode will produce an electric field enhancement which, in turn, will increase charge injection and correspondingly lower the breakdown voltage of the dielectric. Conversely, the voltage of the dielectric may be maximized by providing field-graded electrode substrates. Thus, apart from seeking methods for adhering DLC films to smooth electrodes, the electronic industries have also sought methods for producing smoother electrodes as another means to decrease charge injection and improve the breakdown voltages of dielectrics to thereby maximize capacitor energy storage capacity. In accordance with another embodiment of the present invention, the effect of surface defects may be reduced by grading the electric field at the surface asperities of the electrode with a semiconductive coating deposited by PECVD. The following comparative example, which should not be construed in a limiting sense, is illustrative of the additional precepts of the present invention.

EXAMPLE 2

DLC films of up to about 15,000 Å were deposited onto aluminum-coated silicon wafers as described in Example 1. A process gas stream consisting of a mixture of methane and argon was introduced into the chamber of the Plasma Therm at a preselected flow rate and a pressure of 0.5 Torr.

To grade the electrical field at the asperities of the aluminum, amorphous silicon (a-Si:H) with a resistivity of $10^8$ Ω-cm was deposited on some samples as an interlayer between the aluminum and the DLC film, using a Plasma Therm 2411 deposition system operated at a frequency of 13.56 MHz and mixtures of helium and silane. To improve the adherence of the a-Si:H to the aluminum, some aluminum samples were pretreated with an oxygen plasma etch and/or a silicon oxide ($SiO_2$)coating deposited by the PECVD of a gaseous mixture of $He/SiH_4/N_2O$. The process conditions employed for the oxygen etch and the $SiO_2$, a-Si:H, and DLC film depositions are summarized in Table 3.

TABLE 3

Plasma Etch

| | |
|---|---|
| Flow Rate $O_2$: | 100 sccm |
| Pressure: | 0.75 Torr |
| Power @ 13.56 MHz: | 50 Watts |
| Substrate Temperature | 98° C. |
| Time | 1 min |

$SiO_2$ and a-Si:H Deposition

| | |
|---|---|
| Flow Rate $SiH_4$: | 38 sccm |
| He: | 1838 sccm |
| $N_2O$: | 1215 sccm |
| Pressure: | 0.8 Torr |
| Power @ 13.56 MHz: | 30 Watts |
| Substrate Temperature | 98° C. |
| Time: | 1 min |

After 1 min., the $N_2O$ flow was discontinued and
the $SiH_4$ and He flows were continued for 10 min. at the
following conditions:

| | |
|---|---|
| Flow Rate $SiH_4$: | 38 sccm |
| He: | 1838 sccm |
| Pressure: | 0.8 Torr |
| Power @ 13.56 MHz: | 30 Watts |
| Substrate Temperature | 98° C. |
| Time: | 10 min |

The samples were then placed in the Plasma Therm RIE

TABLE 3-continued system of Example 1 and DLC deposition was carried out under the following conditions:

DLC Deposition
Step 1: Ar Etch

| | |
|---|---|
| Flow Rate Ar: | 100 sccm |
| Pressure: | 0.2 Torr |
| Power @ 13.56 MHz: | 250 Watts |
| Bias | −315 Volts |
| Time | 1 min |
| Substrate Temperature: | 37° C. |

After 11 min., the pressure was increased to 0.5 Torr for 1 min. and other process conditions were changed gradually until the conditons of Step 2 were met.

Step 2: $CH_4$/Ar Deposition

| | |
|---|---|
| Flow Rate Ar: | 100 sccm |
| $CH_4$: | 50 sccm |
| Pressure: | 0.5 Torr |
| Power @ 13.56 MHz: | 250 Watts |
| Bias | −240 Volts |
| Time | 1 min |
| Deposition Temperature: | 37° C. |

Step 3: $CH_4$/Ar Low Power Deposition

| | |
|---|---|
| Flow Rate Ar: | 100 sccm |
| $CH_4$: | 50 sccm |
| Pressure: | 0.5 Torr |
| Power @ 13.56 MHz: | 60 Watts |
| Bias | −75 Volts |
| Deposition Temperature: | 37° C. |
| Deposition Rate: | 100 Å/min |

The process was continued until the desired film thickness was obtained; e.g., 100 min. for a 10,000 Å thick film.

For electrical testing, the samples were metallized by the sputtering of small aluminum pads having a ¼-inch diameter and a thickness of about 1000 Å onto the deposited DLC films. Using the process conditions summarized in Table 4, the following multilayer structures were prepared:

TABLE 4

| Sample | Aluminum | $O_2$ Etch | $SiO_2$ | a-Si:H | DLC | Aluminum |
|---|---|---|---|---|---|---|
| A | 1000 Å | no | — | — | 2899 Å | 1000 Å |
| B | 1000 Å | no | 300 Å | 400 Å | 2128 Å | 1000 Å |
| C | 1000 Å | yes | 300 Å | 400 Å | 2222 Å | 1000 Å |
| D | 1000 Å | no | 300 Å | 400 Å | 10688 Å | 1000 Å |
| E | 1000 Å | yes | 300 Å | 400 Å | 10688 Å | 1000 Å |
| F | 1000 Å | no | — | — | 15000 Å | 1000 Å |
| G | 1000 Å | yes | 300 Å | 400 Å | 13371 Å | 1000 Å |

Breakdown voltage measurements for the above-referenced test samples are tabulated in Table 5.

TABLE 5

| Sample | Pre-coating | Coating Thickness[a] (Å) | Breakdown Strength (MV/cm) |
|---|---|---|---|
| A | none | 2899 | 1.32 |
| B | $SiO_2$/a-Si:H | 2828 | 4.12 |
| C | $O_2$/$SiO_2$/a-Si:H | 2922 | 4.41 |
| D | $SiO_2$/a-Si:H | 11388 | 3.98 |
| E | $O_2$/$SiO_2$/a-Si:H | 11388 | 3.59 |
| F | none | 15000 | 2.80 |
| G | $O_2$/$SiO_2$/a-Si:H | 14071 | 5.16 |

[a]Pre-coating Thickness + DLC Layer Thickness

The results show that the presence of an interfacial layer of $SiO_2$/a-Si:H with or without an oxygen pre-etch leads to an appreciable improvement in breakdown strength. Depending upon design considerations, the process variables, i.e., gas composition, substrate bias, power, deposition time, etc., may be changed in either a stepwise or a continuous fashion to achieve special effects.

Although the improvement in breakdown voltage of a dielectric deposited on electrodes field-graded according to the precepts of the present invention has been illustrated in connection with the coating of aluminum electrodes with $SiO_2$/a-Si:H films with or without an oxygen pre-etch, the described method may be adapted for the coating of various electrode substrates with any semiconducting material by any method, typically with a resistivity in the range of $10^{10}$ to $10^6$ Ω-cm. For example, DLC itself has a resistivity which may be varied over a wide range. Accordingly, DLC films having a relatively low resistivity, i.e., $10^8$ Ω-cm, may be employed instead of a-Si:H to provide field grading. Moreover, the present invention for the field grading of electrodes may be seen as adaptable for use in capacitors and the like employing self-standing standing dielectric films as well as those employing PECVD films.

This aspect of the present invention may also be seen to facilitate the production of capacitors having increased energy storage capabilities. Inasmuch as the energy stored in a capacitor depends on the square of the operating stress of the dielectric, the highest energy storage is realized when the breakdown voltage of the dielectric is maximized. Any defect on the electrode, however, will produce an electric field enhancement which, in turn, will increase charge injection and correspondingly lower the breakdown voltage of the dielectric. Conversely, the voltage of the dielectric may be maximized by providing smooth, defect-free electrode substrates, but defects are inevitable. Accordingly, by practicing the precepts of this aspect of the present invention to effect field-graded electrodes, capacitors having increased energy storage capabilities may be achieved.

What is claimed is:

1. A method for grading the electrical field at the surface of an electrode which comprises the steps of:
   providing a plasma reactor having a grounded electrode, and a further electrode to receive a semiconductive coating,
   maintaining said further electrode at a coating-forming temperature on said grounded electrode,
   powering said plasma reactor at a coating-forming power, and
   passing a mixture of gases comprising (1) silane and helium or (2) at least one hydrocarbon and argon or hydrogen through an electrical discharge to ionize at least a portion thereof to form said semiconductive coating on the surface of said further electrode.

2. The method of claim 1 further comprising the step of depositing a diamondlike carbon layer on said semiconductive coating.

3. The method of claim 2 wherein said mixture of gases comprises silane and helium.

4. The method of claim 3 further comprising the step of etching said surface of said substrate with a plasma prior to depositing said semiconductive coating.

5. The method of claim 3 further comprising the step of depositing an interlayer comprising silicon dioxide on said surface of said electrode prior to depositing said semiconductive coating.

6. The method of claim 5 wherein said silicon oxide interlayer is deposited by passing a gaseous mixture comprising helium, silane and nitrous oxide through said electrical discharge to ionize at least a portion thereof and form said silicon oxide interlayer.

7. The method of claim 3 further comprising the step of etching said surface of said substrate with a plasma prior to depositing said semiconductive coating.

8. The method of claim 7 wherein said plasma comprises ionized oxygen.

9. The method of claim 2 wherein said gases comprise methane and argon or hydrogen.

* * * * *